(12) United States Patent
Matsumoto

(10) Patent No.: US 11,978,757 B2
(45) Date of Patent: May 7, 2024

(54) IMAGE SENSOR AND IMAGE CAPTURING DEVICE

(71) Applicant: NIKON CORPORATION, Tokyo (JP)

(72) Inventor: Shigeru Matsumoto, Sagamahari (JP)

(73) Assignee: NIKON CORPORATION, Tokyo (JP)

(*) Notice: Subject to any disclaimer, the term of this patent is extended or adjusted under 35 U.S.C. 154(b) by 0 days.

(21) Appl. No.: 18/080,865

(22) Filed: Dec. 14, 2022

(65) Prior Publication Data
US 2023/0111474 A1 Apr. 13, 2023

Related U.S. Application Data

(62) Division of application No. 16/953,525, filed on Nov. 20, 2020, now Pat. No. 11,557,624, which is a (Continued)

(30) Foreign Application Priority Data

Mar. 24, 2016 (JP) .................. 2016-060001

(51) Int. Cl.
H01L 27/146 (2006.01)
H04N 25/616 (2023.01)
(Continued)

(52) U.S. Cl.
CPC ........ *H01L 27/1464* (2013.01); *H01L 27/146* (2013.01); *H01L 27/14605* (2013.01); (Continued)

(58) Field of Classification Search
CPC ............... H01L 27/1464; H01L 27/146; H01L 27/14605; H01L 27/14621; (Continued)

(56) References Cited

U.S. PATENT DOCUMENTS 8,792,034 B2 7/2014 Takahashi
2002/0163491 A1 11/2002 Yoshimura et al.
(Continued)

FOREIGN PATENT DOCUMENTS

EP 2528093 A1 11/2012
EP 2871835 A1 5/2015
(Continued)

OTHER PUBLICATIONS

May 16, 2017 International Search Report issued in International Patent Application No. PCT/JP2017/007549.
(Continued)

Primary Examiner — David Vu
Assistant Examiner — Brandon C Fox
(74) Attorney, Agent, or Firm — Oliff PLC

(57) ABSTRACT

An image sensor includes: a pixel substrate that includes a plurality of pixels each having a photoelectric conversion unit that generates an electric charge through photoelectric conversion executed on light having entered therein and an output unit that generates a signal based upon the electric charge and outputs the signal; and an arithmetic operation substrate that is laminated on the pixel substrate and includes an operation unit that generates a corrected signal by using a reset signal generated after the electric charge in the output unit is reset and a photoelectric conversion signal generated based upon an electric charge generated in the photoelectric conversion unit and executes an arithmetic operation by using corrected signals each generated in correspondence to one of the pixels.

17 Claims, 7 Drawing Sheets

Related U.S. Application Data division of application No. 16/085,160, filed as application No. PCT/JP2017/007549 on Feb. 27, 2017, now Pat. No. 10,879,298.

(51) Int. Cl.

| | | |
|---|---|---|
| *H04N 25/63* | (2023.01) | |
| *H04N 25/75* | (2023.01) | |
| *H04N 25/77* | (2023.01) | |
| *H04N 25/771* | (2023.01) | |
| *H04N 25/772* | (2023.01) | |
| *H04N 25/79* | (2023.01) | |
| *H01L 31/02* | (2006.01) | |

(52) U.S. Cl.
CPC .. *H01L 27/14621* (2013.01); *H01L 27/14629* (2013.01); *H01L 27/14643* (2013.01); *H04N 25/616* (2023.01); *H04N 25/63* (2023.01); *H04N 25/75* (2023.01); *H04N 25/77* (2023.01); *H04N 25/771* (2023.01); *H04N 25/772* (2023.01); *H04N 25/79* (2023.01); *H01L 31/02005* (2013.01)

(58) Field of Classification Search
CPC ......... H01L 27/14629; H01L 27/14643; H01L 31/02005; H04N 25/616; H04N 25/75; H04N 25/77; H04N 25/771; H04N 25/79
See application file for complete search history.

(56) References Cited

U.S. PATENT DOCUMENTS

| | | | |
|---|---|---|---|
| 2002/0196170 A1 | 12/2002 | McIlrath | |
| 2008/0251823 A1 | 10/2008 | Lee | |
| 2010/0110257 A1 | 5/2010 | Hiyama et al. | |
| 2011/0309518 A1 | 12/2011 | Kim | |
| 2012/0293698 A1 | 11/2012 | Sukegawa et al. | |
| 2013/0070129 A1 | 3/2013 | Suzuki | |
| 2014/0042299 A1* | 2/2014 | Wan | H01L 27/1464 438/60 |
| 2014/0078367 A1 | 3/2014 | Sonoda | |
| 2014/0211058 A1 | 7/2014 | Nishihara et al. | |
| 2014/0240570 A1 | 8/2014 | Kobayashi et al. | |
| 2015/0077590 A1* | 3/2015 | Kuriyama | H04N 25/443 348/308 |
| 2015/0138408 A1 | 5/2015 | Lee | |
| 2015/0156386 A1 | 6/2015 | Miyakoshi | |
| 2015/0156387 A1* | 6/2015 | Miyakoshi | H04N 23/741 348/367 |
| 2015/0189214 A1 | 7/2015 | Kurose | |
| 2015/0194456 A1 | 7/2015 | Kozlowski | |
| 2015/0350555 A1 | 12/2015 | Nishi | |
| 2016/0295142 A1 | 10/2016 | Yoshida | |
| 2017/0084649 A1 | 3/2017 | Ohmaru et al. | |
| 2017/0186800 A1* | 6/2017 | Ikeda | H01L 27/14616 |
| 2017/0339359 A1* | 11/2017 | Kim | H04N 25/616 |

FOREIGN PATENT DOCUMENTS

| | | |
|---|---|---|
| EP | 2889908 A1 | 7/2015 |
| EP | 3439039 A1 | 2/2019 |
| EP | 3439289 A1 | 2/2019 |
| JP | 2001-094888 A | 4/2001 |
| JP | 2006-186862 A | 7/2006 |
| JP | 2011-159958 A | 8/2011 |
| JP | 2011-172121 A | 9/2011 |
| JP | 2012-248952 A | 12/2012 |
| JP | 2013-090139 A | 5/2013 |
| JP | 2015-023391 A | 2/2015 |
| JP | 2015-41838 A | 3/2015 |
| JP | 2015-126043 A | 7/2015 |
| WO | 2017/169446 A1 | 10/2017 |
| WO | 2017/169480 A1 | 10/2017 |

OTHER PUBLICATIONS

Itoh Y et al; 4-LAYER 3-D IC with a function of parallel signal processing:, Microelectronic Engineering; vol. 15, No. 1-4, Oct. 1991; pp. 187-190.
Aug. 19, 2019 Search Report issued in European Patent Application No. 17769819.8.
Nov. 12, 2019 Office Action issued in Japanese Patent Application No. 2018-507162.
Feb. 20, 2020 Office Action issued in U.S. Appl. No. 16/085,160.
Apr. 21, 2020 Office Action issued in Japanese Patent Application No. 2018-507162.
Jun. 30, 2020 Office Action issued in Indian Patent Application No. 201817039920.
Jul. 3, 2020 Office Action issued in Chinese Patent Application No. 201780032301.4.
Aug. 20, 2020 Notice of Allowance issued in U.S. Appl. No. 16/085,160.
Sep. 8, 2020 Office Action issued in European Patent Application No. 17769819.8.
Sep. 6, 2021 Office Action issued in European Patent Application No. 17769819.8.
Jan. 25, 2022 Office Action issued in Japanese Patent Application No. 2021-000247.
Oct. 11, 2022 Office Action issued in Japanese Patent Application No. 2021-000247.
Jun. 27, 2022 Office Action issued in U.S. Appl. No. 16/953,525.
Sep. 13, 2022 Notice of Allowance issued in U.S. Appl. No. 16/953,525.
Aug. 30, 2023 Office Action issued in Indian Patent Application No. 201817039920.

\* cited by examiner

IMAGE SENSOR AND IMAGE CAPTURING DEVICE

This is a divisional of U.S. patent application Ser. No. 16/953,525 filed Nov. 20, 2020 (now U.S. Pat. No. 11,557, 624), which in turn is a divisional of U.S. patent application Ser. No. 16/085,160 filed Sep. 14, 2018 (now U.S. Pat. No. 10,879,298), which is the U.S. National Stage of International Application No. PCT/JP2017/007549 filed Feb. 27, 2017, and which claims priority from Japanese Application No. 2016-060001 filed in Japan on Mar. 24, 2016. The disclosure of each of the prior applications is incorporated herein by reference in their entireties.

TECHNICAL FIELD

The present invention relates to an image sensor and image capturing device.

BACKGROUND ART

There is an image sensor known in the related art that executes arithmetic operations by using signals output from adjacent pixels (PTL1). In this image sensor, no correlated double sampling (CDS) is executed prior to an arithmetic operation executed by using pixel signals, and for this reason, a noise signal component originating from each pixel cannot be removed.

CITATION LIST

Patent Literature

PTL1: Japanese Laid Open Patent Publication No. 2001-94888

SUMMARY OF INVENTION

According to the 1st aspect of the present invention, an image sensor comprises: a pixel substrate that includes a plurality of pixels each having a photoelectric conversion unit that generates an electric charge through photoelectric conversion executed on light having entered therein and an output unit that generates a signal based upon the electric charge and outputs the signal; and an arithmetic operation substrate that is laminated on the pixel substrate and includes an operation unit that generates a corrected signal by using a reset signal generated after the electric charge in the output unit is reset and a photoelectric conversion signal generated based upon an electric charge generated in the photoelectric conversion unit and executes an arithmetic operation by using corrected signals each generated in correspondence to one of the pixels.

According to the 2nd aspect of the present invention, an image sensor comprises: a pixel substrate at which a plurality of pixels, each having a photoelectric conversion unit and an output unit, are disposed; and an arithmetic operation substrate at which an operation unit that generates a corrected signal by using a reset signal, resulting from digital conversion of a signal generated after resetting the output unit, and a photoelectric conversion signal, resulting from digital conversion of a signal generated through photoelectric conversion at the photoelectric conversion unit, and executes an arithmetic operation with corrected signals, each generated in correspondence to one of the pixels, is disposed in correspondence to each of the pixels, wherein: the pixel substrate and the arithmetic operation substrate are laminated one upon another.

According to the 3rd aspect of the present invention, an image capturing device comprises: an image sensor according to the 1st or the 2nd aspect; and an image generation unit that generates image data based upon signals provided from the pixels.

DESCRIPTION OF EMBODIMENT

First Embodiment

Figure 1:
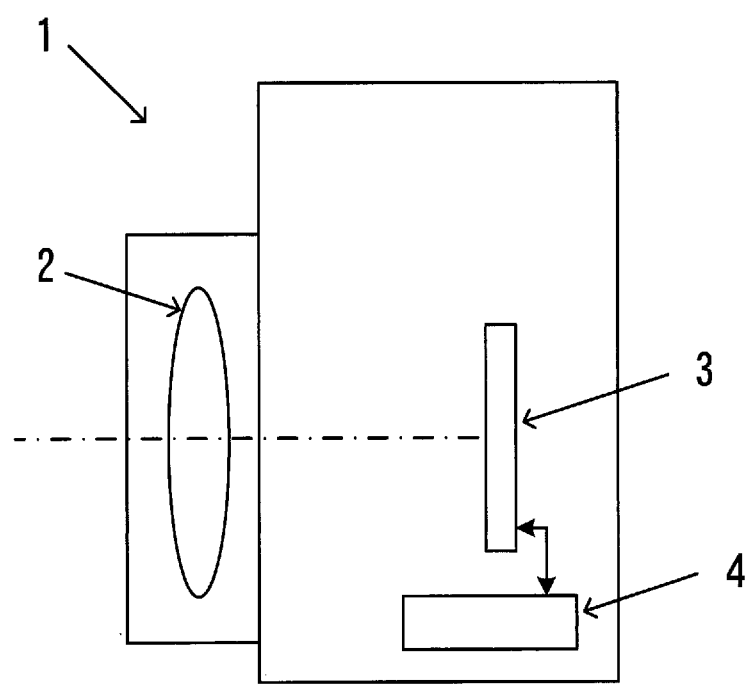
FIG. 1 A block diagram illustrating the structure adopted in the image capturing device achieved in a first embodiment FIG. 2 A sectional view of the structure adopted in the image sensor in the first embodiment FIG. 3 A block diagram illustrating the structure of the image sensor achieved in the first embodiment FIG. 4 A circuit diagram illustrating the structure adopted in a pixel in the first embodiment FIG. 5 A block diagram illustrating in detail the structure adopted in the image sensor in the first embodiment FIG. 6 A timing chart pertaining to the operation executed in the image sensor in the first embodiment FIG. 7 A block diagram illustrating in detail the structure adopted in an image sensor achieved as variation 1

FIG. 1 is a block diagram illustrating the structure adopted in the image capturing device achieved in the first embodiment. An image capturing device 1 includes a photographic optical system 2, an image sensor 3 and a control unit 4. The image capturing device 1 may be, for instance, a camera. The photographic optical system 2 forms a subject image on the image sensor 3. The image sensor 3 generates image signals by capturing the subject image formed via the photographic optical system 2. The image sensor 3 may be, for instance, a CMOS image sensor. The control unit 4 outputs a control signal to control an operation of the image sensor 3, to the image sensor 3. In addition, the control unit 4 functions as an image generation unit that generates image data by executing various types of image processing on image signals output from the image sensor 3. It is to be noted that the photographic optical system 2 may be a detachable system that can be mounted at or dismounted from the image capturing device 1.

Figure 2:
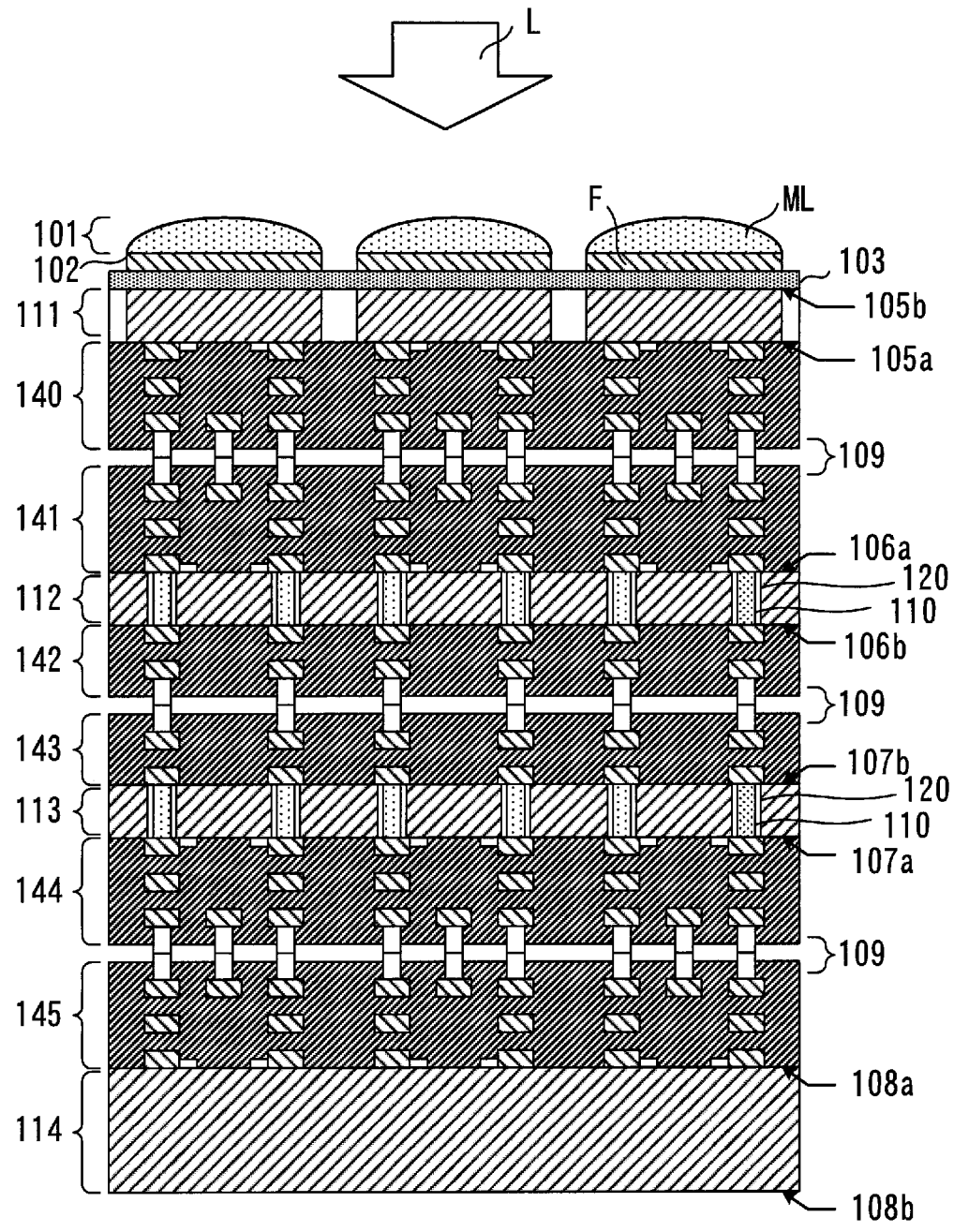

FIG. 2 shows the structure adopted in image sensor in the first embodiment in a sectional view. The image sensor 3 shown in FIG. 2 is a backside-illumination image sensor. The image sensor 3 includes a first substrate 111, a second substrate 112, a third substrate 113 and a fourth substrate 114. The first substrate 111, the second substrate 112, the third substrate 113 and the fourth substrate 114 are each constituted with, for instance, a semiconductor substrate. The first substrate 111 is laminated on the second substrate 112, the second substrate 112 is laminated on the third substrate 113 and the third substrate 113 is laminated on the fourth substrate 114. As the unfilled arrow in FIG. 7 indicates, incident light L enters the image sensor 3 primarily toward the + side along a Z axis. In addition, coordinate axes are set so that the left side of the drawing sheet along an X axis running perpendicular to the Z axis is the X axis + side and that the side closer the viewer looking at the drawing along a Y axis running perpendicular to both the Z axis and the X axis is the Y axis + side.

The image sensor 3 further includes a microlens layer 101, a color filter layer 102 and a passivation layer 103. The passivation layer 103, the color filter layer 102 and the microlens layer 101 are laminated at the first substrate 111 in sequence. The microlens layer 101 includes a plurality of microlenses ML. A microlens ML condenses light having entered therein onto a photoelectric conversion unit 12 to be described later. The color filter layer 102 includes a plurality of color filters F. The passivation layer 103 is constituted with a nitride film or an oxide film.

The first substrate 111, the second substrate 112, the third substrate 113 and the fourth substrate 114 respectively include first surfaces 105a, 106a, 107a and 108a, at which gate electrodes and gate insulating films are disposed, and second surfaces 105b, 106b, 107b and 108b, which are different from the first surfaces. In addition, various elements such as transistors are disposed at the first surfaces 105a, 106a, 107a and 108a. Wiring layers 140, 141, 144 and 145 are laminated respectively on the first surface 105a of the first substrate 111, on the first surface 106a of the second substrate 112, on the first surface 107a of the third substrate 113 and on the first surface 108a of the fourth substrate 114. Furthermore, substrate connecting layers 142 and 143 are laminated respectively on the second surface 106b of the second substrate 112 and on the second surface 107b of the third substrate 113. The wiring layers 140 through 145 each include a conductor film (metal film) and an insulating film, with a plurality of wirings and vias disposed therein.

The elements disposed at the first surface 105a of the first substrate 111 and the elements disposed at the first surface 106a of the second substrate 112 are electrically connected by connecting portions 109, such as bumps or electrodes, via the wiring layers 140 and 141, and the elements disposed at the first surface 107a of the third substrate 113 and the elements disposed at the first surface 108a of the fourth substrate 114 are likewise electrically connected by connecting portions 109, such as bumps or electrodes, via the wiring layers 144 and 145. In addition, the second substrate 112 and the third substrate 113 each include through holes 120 formed so as to pass from the first surface through to the second surface of the substrate and a plurality of through electrodes 110, such as through silicon vias, each disposed to range from the first surface through to the second surface via a through hole 120. A through electrode 110 disposed at the second substrate 112 connects a circuit disposed at the first surface 106a with a circuit disposed at the second surface 106b of the second substrate 112, whereas a through electrode 110 disposed at the third substrate 113 connects a circuit disposed at the first surface 107a with a circuit disposed at the second surface 107b of the third substrate 113. A circuit disposed at the second surface 106b of the second substrate 112 and a circuit disposed at the second surface 107b of the third substrate 113 are electrically connected with each other by a connecting portion 109, such as a bump or an electrode, via the substrate connecting layers 142 and 143.

Figure 3:
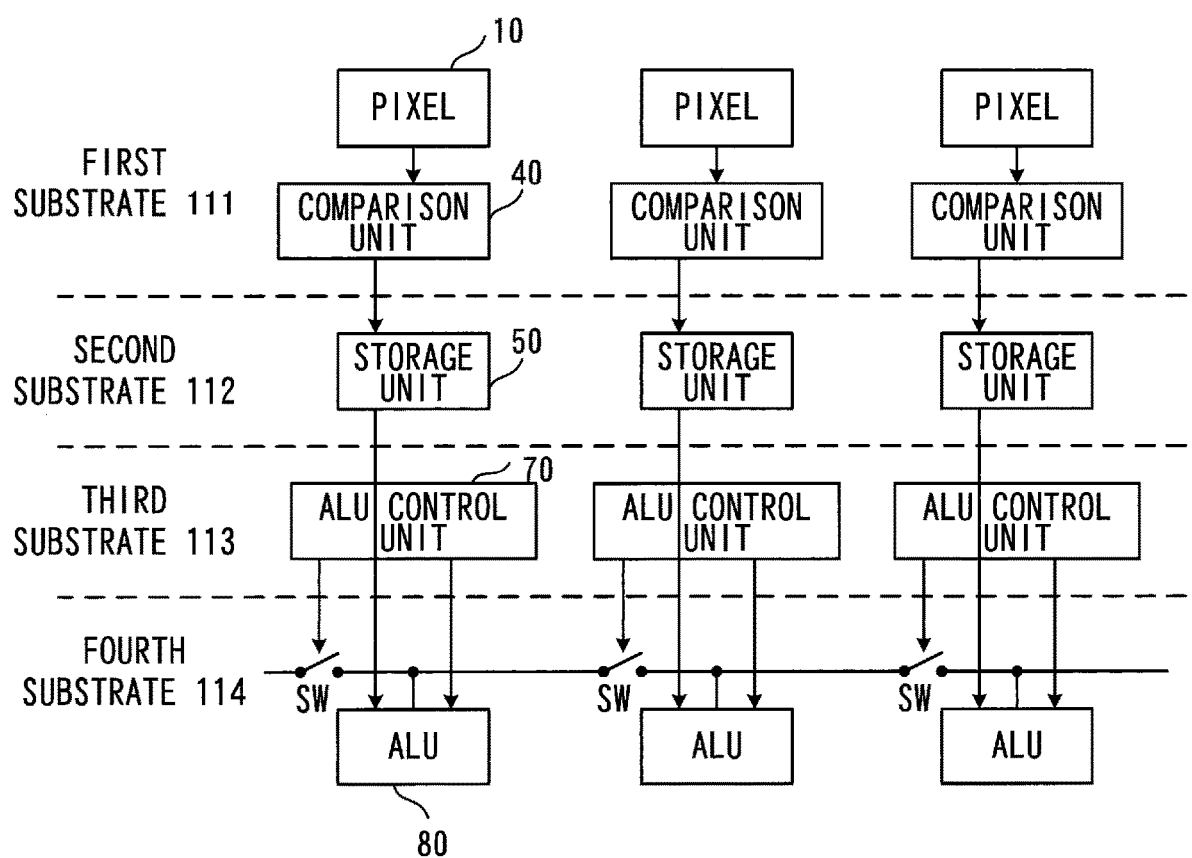

FIG. 3 is a block diagram illustrating the structure adopted in the image sensor in the first embodiment. The first substrate 111 includes a plurality of pixels 10 and a plurality of comparison units 40, both disposed in a two-dimensional pattern. The plurality of pixels 10 are disposed both along the X axis and along the Y axis shown in FIG. 2. The pixels 10 each output a photoelectric conversion signal and a noise signal, which will be described later, to a comparison unit 40. The comparison units 40, each disposed in correspondence to one of the pixels 10, are constituted with comparator circuits or the like. A comparison unit 40 compares the photoelectric signal and the noise signal output from the corresponding pixel 10 individually with a reference signal, and outputs comparison results to the second substrate 112. The second substrate 112 includes a plurality of storage units 50. The storage units 50, each disposed in correspondence to one of the pixels 10, are constituted with latch circuits or the like. Based upon the comparison results provided by the corresponding comparison unit 40, a count value corresponding to the length of time having elapsed since the start of comparison executed by the comparison unit 40 is stored as a digital signal into each storage unit 50. A digital signal corresponding to the photoelectric conversion signal and a digital signal corresponding to the noise signal are stored in the storage unit 50. In addition, the storage unit 50 also functions as an accumulating unit 50 that accumulates the photoelectric conversion signal and the noise signal (reset signal) having been converted to digital signals. As will be explained in detail later, the comparison unit 40 and the storage unit 50 constitute an integrated A/D conversion unit that converts the photoelectric conversion signal and the noise signal to digital signals. The digital signals stored in the storage unit 50 are output via the third substrate 113 to the fourth substrate 114.

The fourth substrate 114 includes a plurality of ALUs (arithmetic and logic units), i.e., arithmetic operation units 80. The arithmetic operation units 80, each disposed in correspondence to one of the pixels 10, execute signal processing, such as correlated double sampling (CDS) through subtraction using the digital signal generated based upon the photoelectric conversion signal and the digital signal generated based upon the noise signal, and an arithmetic operation executed by using signals generated in correspondence to individual pixels. The arithmetic operation units 80 are each configured so as to include an adding circuit, a subtracting circuit, a flip-flop circuit, a shift circuit and the like. The various arithmetic operation units 80 are connected with one another via signal lines, switches SW and the like.

The third substrate 113 includes ALU control units 70 (hereafter referred to as control units 70) that control the arithmetic operation units 80. The control units 70 are each disposed in correspondence to one of the pixels 10 and each control specific details and the like of arithmetic operations executed by the corresponding arithmetic operation unit 80 by outputting a control signal to the arithmetic operation unit 80, a switch SW or the like disposed in the fourth substrate 114. For instance, a control unit 70 selects signals from specific pixels by executing ON control of specific switches SW and in response, the arithmetic operation unit 80 corresponding to the particular control unit 70 executes arithmetic operation processing on the signals from the plurality of pixels having been selected. It is to be noted that the first substrate 111 is configured as a pixel substrate 111 that includes the plurality of pixels 10 each having a photoelectric conversion unit 12 and a readout unit (output unit) to be explained later, whereas the second substrate 112 is configured as an accumulation substrate 112 that includes the accumulating units 50 (storage units 50). In addition, the fourth substrate 114 is configured as an arithmetic operation substrate 114 that includes the arithmetic operation units 80.

In the embodiment, correlated double sampling is executed prior to an arithmetic operation executed by using the signals provided from the individual pixels 10. This means that an arithmetic operation can be executed by using the signals provided from selected pixels 10 after the noise signal component originating in each pixel 10 is removed from the corresponding signal. In addition, the arithmetic operation unit 80 and the control unit 70 are laminated on the pixel 10. This makes it possible to prevent a decrease in the opening ratio at the pixel 10. Furthermore, the control units 70 in the third substrate 113 each control the corresponding arithmetic operation unit 80 disposed in the fourth substrate 114 by providing a control signal to the arithmetic operation unit 80 along the direction in which the Z axis extends in FIG. 2. As a result, an arithmetic operation can be executed by using the signals from selected pixels 10 without having to increase the chip area in the image sensor 3.

Figure 4:
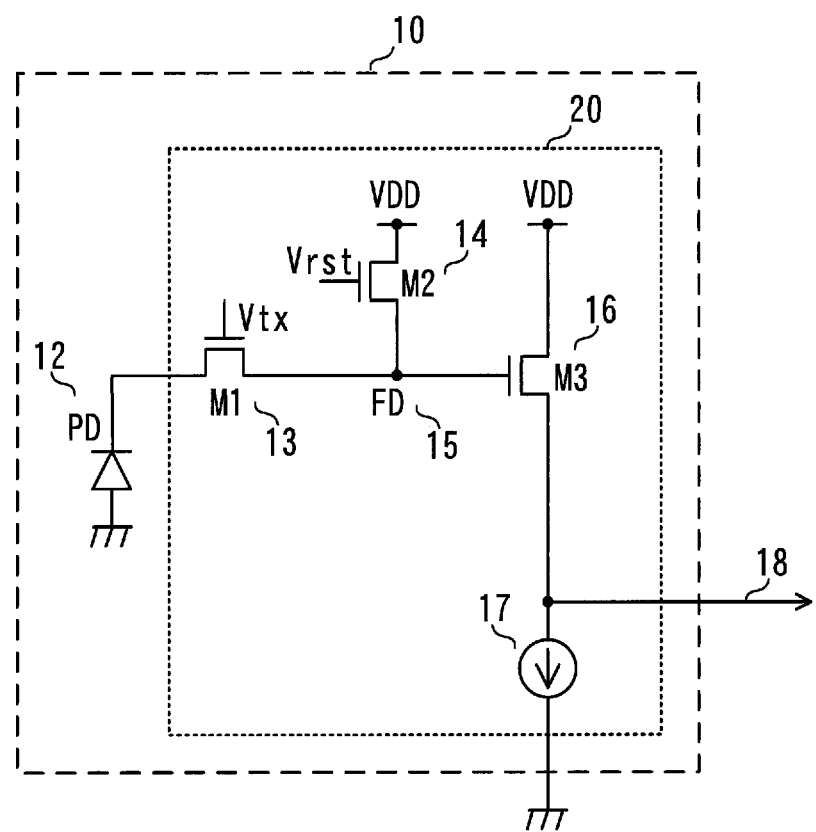

FIG. 4 is a circuit diagram illustrating the structure adopted in a pixel in the image sensor in the first embodiment. The pixels 10 each include a photoelectric conversion unit 12 constituted with, for instance, a photodiode (PD) and a readout unit 20. The photoelectric conversion unit 12 has a function of converting light having entered therein to an electric charge and accumulating the electric charge resulting from the photoelectric conversion. The readout unit 20 includes, for instance, a transfer unit 13, a discharge unit 14, a floating diffusion (FD) 15, an amplifier unit 16 and a current source 17.

The transfer unit 13, which is controlled with a signal Vtx, transfers the electric charge resulting from the photoelectric conversion executed at the photoelectric conversion unit 12 to the floating diffusion 15. In other words, the transfer unit 13 forms an electric charge transfer path between the photoelectric conversion unit 12 and the floating diffusion 15. The electric charge is held (accumulated) at the floating diffusion 15. The amplifier unit 16 amplifies a signal generated based upon the electric charge held in the floating diffusion 15 and outputs the amplified signal to a signal line 18. In the example presented in FIG. 4, the amplifier unit 16 is constituted with a transistor M3 with the drain terminal, the gate terminal and the source terminal thereof respectively connected to a source VDD, the floating diffusion 15 and the current source 17.

The discharge unit (reset unit) 14, which is controlled with a signal Vrst, discharges the electric charge at the floating diffusion 15, thereby resetting the potential at the floating diffusion 15 to a reset potential (reference potential). The transfer unit 13 and the discharge unit 14 may be constituted with, for instance, a transistor M1 and a transistor M2 respectively.

The readout unit 20 reads out, in sequence, a signal (photoelectric conversion signal) corresponding to the electric charge transferred from the photoelectric conversion unit 12 to the floating diffusion 15 via the transfer unit 13 and a signal (noise signal), generated as the potential at the floating diffusion 15 is reset to the reset potential, to the signal line 18. The readout unit 20 functions as an output unit 20 that generates a signal based upon an electric charge accumulated in the floating diffusion 15 and outputs the signal thus generated. The output unit 20 outputs the photoelectric conversion signal and the noise signal to the signal line 18.

Figure 5:
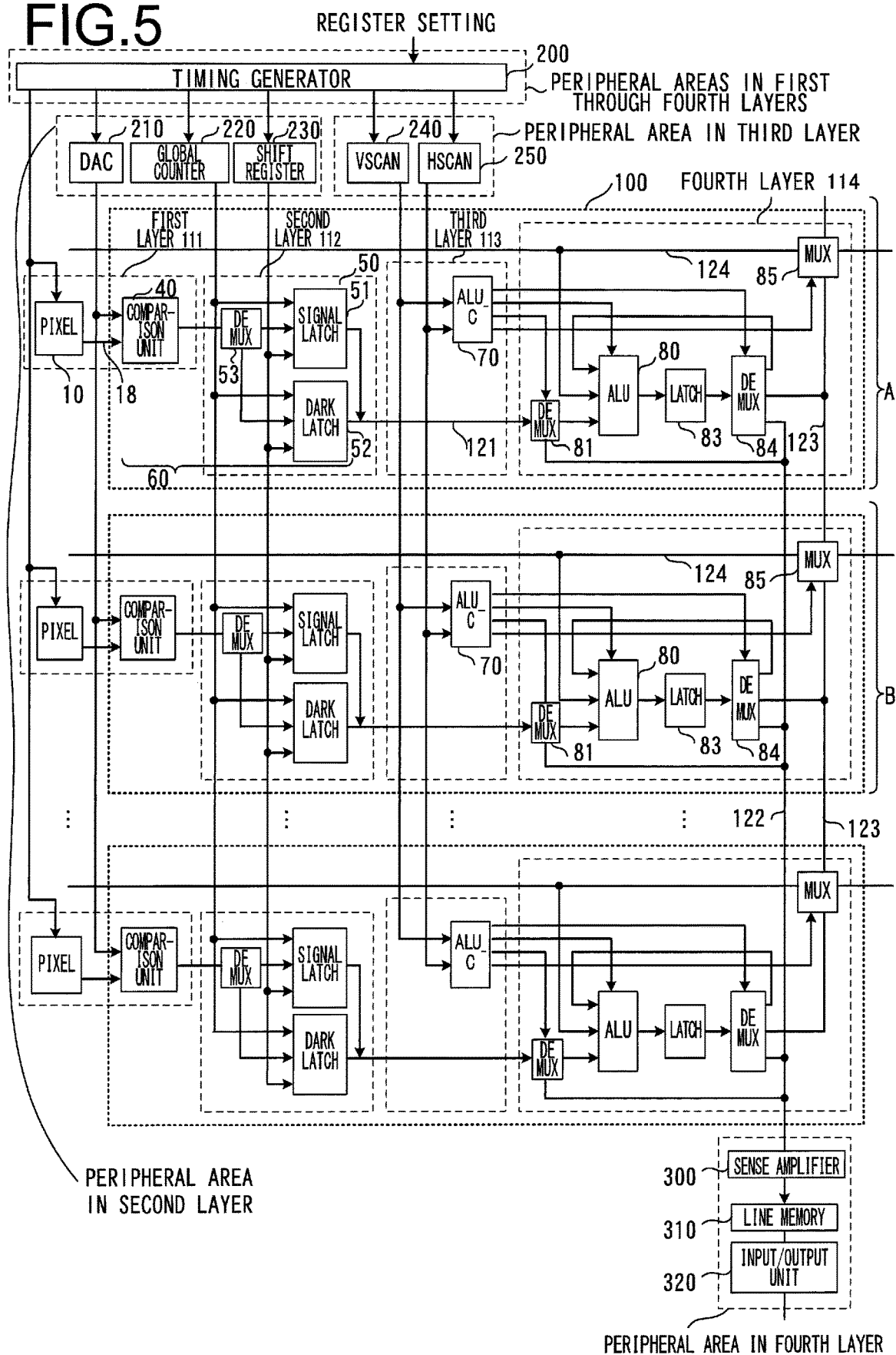

FIG. 5 is a block diagram illustrating in detail the structure adopted in the image sensor in the first embodiment. The image sensor includes a plurality of pixels 10, operation units 100 each disposed in correspondence to one of the pixels 10, a timing generator 200, a D/A conversion unit 210, a global counter 220, a shift register 230, a VSCAN circuit (vertical scanning circuit) 240, an HSCAN circuit (horizontal scanning circuit) 250, a sense amplifier 300, a line memory 310 and an input/output unit 320. The operation units 100 each include an analog/digital conversion unit (A/D conversion unit) 60, a control unit 70, an arithmetic operation unit 80, a storage unit 83, a demultiplexer 81, a demultiplexer 84 and a multiplexer 85. The A/D conversion unit 60 is configured with a comparison unit 40, a storage unit 50 and a demultiplexer 83. In addition, the storage unit 50 includes a signal storage unit 51 where a digital signal corresponding to the photoelectric conversion signal is stored and a noise storage unit 53 where a digital signal corresponding to the noise signal is stored. The signal storage unit 51 and the noise storage unit 52 are each constituted with a plurality of latch circuits corresponding to the number of bits in the signal stored therein. For instance, the signal storage unit 51 and the noise storage unit 52 may each be constituted with 12 latch circuits and in such a case, the digital signals stored in the signal storage unit 51 and the noise storage unit 52 are each a 12-bit parallel signal.

At a first layer, i.e., the first substrate 111 in the image sensor 3, the pixels 10, the comparison units 40 and part of the timing generator 200 are disposed. The timing generator 200 is configured with a plurality of circuits that are disposed at the different substrates, i.e., the first substrate 111 through the fourth substrate 114. It is to be noted that the first substrate 111, the second substrate 112, the third substrate 113 and the fourth substrate 114 are respectively notated as a first layer, a second layer, a third layer and a fourth layer in FIG. 5. The various circuits constituting the timing generator 200 are disposed at the periphery of the area where the pixels 10 and the operation units 100 are disposed. At the second layer, i.e., the second substrate 112, the signal storage units 51, the noise storage units 52, the demultiplexers 53, the D/A conversion unit 210, the global counter 220, the shift register 230 and part of the timing generator 200 are disposed.

At the third substrate 113, the control units 70, the VSCAN circuit 240, the HSCAN circuit 250 and part of the timing generator 200 are disposed. At the fourth substrate 114, the arithmetic operation units 80, the storage units 83, the demultiplexers 81, the demultiplexers 84, the sense amplifier 300, the line memory 310 and the input/output unit 320 are disposed. In addition, the D/A conversion unit 210, the global counter 220, the shift register 230, the VSCAN circuit 240, the HSCAN circuit 250, the sense amplifier 300, the line memory 310 and the input/output unit 320 are disposed at the periphery of the areas where the operation units 100 are present at the various substrates.

The timing generator 220, constituted with a pulse generation circuit or the like, generates a pulse signal and the like based upon a register value setting output from the control unit 4 in the image capturing device 1 and outputs the pulse signal or the like thus generated to the individual pixels 10, the D/A conversion unit 210, the global counter 220, the shift register 230, the VSCAN circuit 240 and the HSCAN circuit 250. The register value setting is selected in correspondence to, for instance, the shutter speed (the length of time over which electric charges are accumulated in the photoelectric conversion units), the ISO sensitivity, whether or not image correction is executed or the like. The D/A conversion unit 210 generates, based upon the pulse signal provided from the timing generator 200, a ramp signal with a shifting signal level, which is to be used as a reference signal. In addition, the D/A conversion unit 210 is commonly connected to the individual comparison units 40 each disposed in correspondence to one of the pixels 10, and outputs the reference signal to the comparison units 40. The global counter 220 generates a clock signal indicating a count value based upon the pulse signal provided from the timing generator 200, and outputs the clock signal thus generated to the signal storage unit 51 and the noise storage unit 52. The shift register 230 generates a timing signal based upon the pulse signal provided from the timing generator 200 and outputs the timing signal thus generated to the signal storage unit 51 and the noise storage unit 52.

The VSCAN circuit 240 and the HSCAN circuit 250 each sequentially select the individual control units 70 based upon a signal provided by the timing generator 200 and each output a signal, indicating to each control unit 70, the details of an arithmetic operation (among the four arithmetic operations) to be executed in the arithmetic operation unit 80 and the pixels 10 and the like selected as the arithmetic operation targets. The sense amplifier 300 is connected to a signal line 122 to which the operation units, each disposed in correspondence to one of the pixels 10, are connected, and reads out signals at high speed by amplifying signals input to the signal line 122 and reading out the amplified signals. The signals having been read out by the sense amplifier 300 are stored in the line memory 310. The input/output unit 320 executes signal processing such as signal bit-width adjustment and synchronization code assignment for signals output from the line memory 310 and outputs signals resulting from the signal processing as image signals to the control unit 4 of the image capturing device 1. The input/output unit 320 constituted with, for instance, an input/output circuit supporting a high-speed interface such as an LVDS or an SLVS, transmits signals at high speed.

Figure 6:
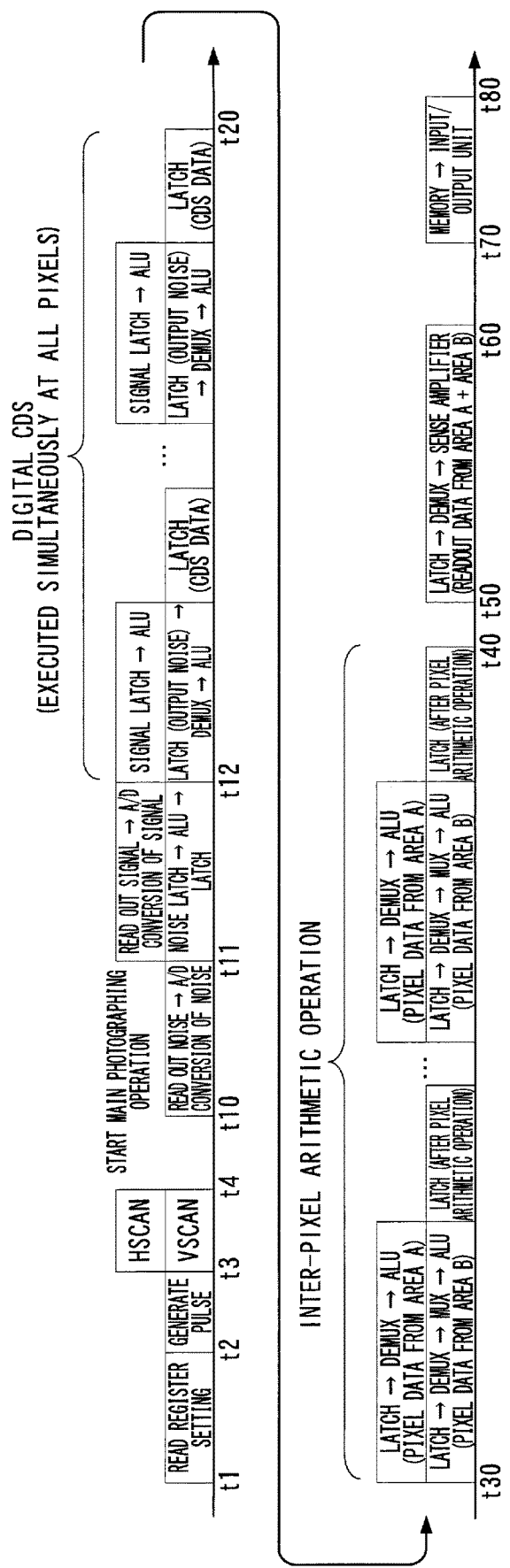

FIG. 6 is a timing chart pertaining to an example of an operation that may be executed in the image sensor in the first embodiment. In FIG. 6, time points are indicated along the horizontal axis. During a time period elapsing between a time point t1 and a time point t2, register setting information is input to the timing generator 200 from the control unit 4 of the image capturing device 1. During a time period elapsing between the time point t2 and a time point t3, the timing generator 200 generates signals indicating arithmetic operation details and the like for the individual arithmetic operation units 80, based upon the register value setting information and outputs the signals thus generated to the VSCAN circuit 240 and the HSCAN circuit 250. During a time period elapsing between the time point t3 and a time point t4, the VSCAN circuit 240 and the HSCAN circuit 250 sequentially output the signals indicating the arithmetic operation details or the like, which have been generated by the timing generator 200, to the individual control units 70, each disposed in correspondence to one of the pixels 10.

During a time period elapsing between a time point t10 and a time point t11, a noise signal from each pixel 10 is output to the corresponding comparison unit 40. The comparison unit 40 compares the noise signal read out from the pixel 10 with a reference signal provided from the D/A conversion unit 210 and outputs comparison results to the demultiplexer 53. The demultiplexer 53 outputs the comparison results provided by the comparison unit 40 to the noise storage unit 52. A count value that corresponds to the length of time having elapsed between the start of the comparison executed by the comparison unit 40 and the output of the comparison results, is stored as a digital signal corresponding to the noise signal into the noise storage unit 52 based upon the comparison results provided by the comparison unit 40 and a clock signal provided by the global counter 220.

During a time period elapsing between the time point t11 and a time point t12, the photoelectric conversion signal in each pixel 10 is output to the corresponding comparison unit 40. The comparison unit 40 compares the photoelectric conversion signal with a reference signal and outputs comparison results to the demultiplexer 53. The demultiplexer 53 outputs the comparison results provided by the comparison unit 40 to the signal storage unit 51. A count value that corresponds to the length of time having elapsed since the start of the comparison executed by the comparison unit 40 and the comparison results output, is stored as a digital signal corresponding to the photoelectric conversion signal in the signal storage unit 51 based upon the comparison results provided by the comparison unit 40 and the clock signal. Through this process, 12-bit digital signals are individually stored into the signal storage unit 51 and the noise storage unit 52 in the embodiment.

In addition, during the time period elapsing between the time point t11 and the time point t12, the noise storage unit 52 sequentially outputs a signal, generated by time shifting the 12-bit digital signal stored in the noise storage unit 52 by one bit at a time, to a signal line 121 shown in FIG. 5 based upon a timing signal provided from the shift register 230. The serial signal output to the signal line 121 is input to the demultiplexer 81. The demultiplexer 81 outputs the serial signal provided from the noise storage unit 52 to the arithmetic operation unit 80. The arithmetic operation unit 80 stores, in sequence, the digital signal corresponding to the noise signal into the storage unit 83. As a result, a 12-bit digital signal corresponding to the noise signal is stored into the storage unit 83.

The signal line 121 is a signal line connecting the storage unit 50 at the second substrate 112 with the demultiplexer 81 at the fourth substrate 114, which may be constituted with the through electrode 110 shown in FIG. 2, bumps or the like. It is difficult to form numerous through electrodes 110 with a narrow pitch and, for this reason, it is difficult to simultaneously transfer numerous parallel signals from the second substrate 112 to the fourth substrate 114. In the embodiment, the parallel signals stored in the storage units 50 at the second substrate are converted to serial signals and the serial signals are output to the fourth substrate 114. This means that the number of wirings connecting the second substrate 112 with the fourth substrate 114 can be reduced and digital signals corresponding to the individual pixels 10 can be simultaneously output. Furthermore, since through electrodes 110 or the like do not need to be formed in a great quantity, an increase in the chip area can be minimized.

During a time period elapsing between the time point t12 and a time point t20, the signal storage unit 51 converts the digital signal corresponding to the photoelectric conversion signal stored in the signal storage unit 51 to a serial signal based upon a timing signal provided from the shift register 230 and sequentially outputs the serial signal in correspondence to one bit at a time to the demultiplexer 81 via the signal line 121. The demultiplexer 81 outputs the serial signal provided by the signal storage unit 51 to the arithmetic operation unit 80. Based upon a control signal provided by the control unit 70, the arithmetic operation unit 80 outputs the 12-bit digital signal corresponding to the noise signal stored in the storage unit 83 to the demultiplexer 84 in correspondence to one bit at a time. Based upon a control signal provided by the control unit 70, the demultiplexer 84 outputs (feeds back) the digital signal corresponding to the noise signal to the arithmetic operation unit 80.

The arithmetic operation unit 80 generates a corrected signal through subtraction operation executed by using the digital signal corresponding to the photoelectric conversion signal, output one bit at a time from the signal storage unit 51, and the digital signal corresponding to the noise signal, output one bit at a time from the storage unit 83. The arithmetic operation unit 80 sequentially stores the corrected signal, generated in correspondence to a single bit, into the storage unit 83. The arithmetic operation unit 80 executes the subtraction operation a plurality of times in correspondence to the number of bits in the signal stored in the storage unit 50 and sequentially stores the corrected signal indicating the subtraction results into the storage unit 83. In the embodiment, 12-bit digital signals are stored in the signal storage unit 51 and the noise storage unit 52 constituting the storage unit 50, and thus, the subtraction processing is executed 12 times. Digital signals corresponding to the 12-bit noise signal and the corrected signal each corresponding to one of the 12 bits are stored into the storage unit 83. Accordingly, the storage unit 83 is constituted with 24 latch circuits or the like.

In the embodiment described above, the digital CDS is executed to calculate the difference between the digital signal corresponding to the photoelectric conversion signal and the digital signal corresponding to the noise signal through time division so as to determine the difference in correspondence to each bit. In addition, the arithmetic operation units 80 are each disposed in correspondence to one of the pixels 10 and thus, the digital CDS is simultaneously executed at all the pixels 10. Since the digital CDS operation is executed in correspondence to each bit, numerous digital circuits such as flip-flop circuits do not need to be disposed in correspondence to multiple bits (e.g., 12 bits) at the fourth substrate 114. As a result, the number of circuits required in each pixel 10 can be reduced, which, in turn, makes it possible to prevent an increase in the chip area.

During a time period elapsing between a time point t30 and a time point t40, an arithmetic operation is executed in conjunction with the corrected signals pertaining to two pixels 10 disposed in, for instance, an area A and an area B adjacent to each other in FIG. 5. Namely, the 12-bit corrected signal stored in the storage unit 83 at the pixel 10 disposed in the area A is input (fed back), one bit at a time, to the arithmetic operation unit 80 in the area A via the corresponding demultiplexer 84. Likewise, the 12-bit corrected signal stored in storage unit 83 at the pixel 10 disposed in the area B is input, one bit at a time, to the arithmetic operation unit 80 in the area A via the demultiplexer 84 in the area B, the multiplexer 85 in the area B and the multiplexer 85 in the area A. The arithmetic operation unit 80 in the area A executes an arithmetic operation in correspondence to one bit at a time, by using the 12-bit corrected signal from the area A and the 12-bit corrected signal from the area B. This operation will be described in detail below.

In the operation unit 100 disposed in the area A, the arithmetic operation unit 80 included therein outputs the 12-bit corrected signal corresponding to the pixel 10 in the area A, stored in the storage unit 83 in the area A, to the demultiplexer 84, one bit at a time. The demultiplexer 84 in the area A outputs (feeds back) the corrected signal to the arithmetic operation unit 80 in the area A. In addition, in the operation unit 100 disposed in the area B, which includes the arithmetic operation unit 80, outputs the corrected signal corresponding to the pixel 10 in the area B, which is stored in the storage unit 83 in the area B, to the demultiplexer 84 one bit at a time. The demultiplexer 84 in the area B outputs the corrected signal to the multiplexer 85 in the area B.

A signal line 123 and a signal line 124, to which the individual operation units 100 are connected, are connected to the multiplexer 85 disposed in correspondence to each pixel 10. The signal lines 123 and the signal lines 124 disposed in a two-dimensional pattern to extend along the row direction and along the column direction at, for instance, the fourth substrate 114, are connected to the operation units 100 each disposed in correspondence to one of the pixels 10. A multiplexer 85, controlled by the corresponding control unit 70, selects a signal to undergo the arithmetic operation in the arithmetic operation unit 80 from corrected signals input to the corresponding signal lines 123 and 124. The multiplexer 85 in the area B outputs the corrected signal generated for the pixel in the area B to the multiplexer 85 in the area A via the signal line 123 shown in FIG. 5. The multiplexer 85 in the area A outputs the corrected signal for the pixel 10 in the area B to the arithmetic operation unit 80 in the area A via the signal line 124. The corrected signal from the pixel 10 in the area A and the corrected signal from the pixel 10 in the area B are sequentially input, one bit at a time, to the arithmetic operation unit 80 in the area A.

The arithmetic operation unit 80 in the area A generates a pixel signal through an arithmetic operation executed by using the corrected signal output one bit at a time from the storage unit 83 in the area A and the corrected signal output one bit at a time from the storage area 83 in the area B. The arithmetic operation unit 80 sequentially stores the pixel signal, generated in correspondence to a single bit, into the storage unit 83. The arithmetic operation unit 80 executes the arithmetic operation a plurality of times in correspondence to the number of bits in each corrected signal and sequentially stores the pixel signals indicating the arithmetic operation results into the storage unit 83. Following the arithmetic operation executed by using the corrected signals, the 12-bit corrected signal and a 12-bit pixel signal will have been stored in the storage unit 83.

As described above, a corrected signal is generated in the embodiment through correlated double sampling executed prior to the arithmetic operation, which is executed by using the corrected signals from the individual pixels 10. This means that the arithmetic operation can be executed with the corrected signals from selected pixels 10 by first removing the noise signal component from the individual signals each originating from one of the pixels 10. In addition, the arithmetic operation is executed in correspondence to each bit in conjunction with the corrected signals generated for the individual pixels 10 in the embodiment. As a result, since multiple-bit digital circuits such as multiple-bit (e.g., 12 bit) basic mathematical operation circuits, multiple-bit (e.g., 12 bit) flip-flop circuits and the like do not need to be disposed at the fourth substrate 114, no increase in the chip area is required. Since the arithmetic operation is executed with the corrected signals in correspondence to one bit at a time, the circuit area of the individual arithmetic operation units 80 can be kept down. Furthermore, the arithmetic operation units 80 each execute an arithmetic operation by using corrected signals generated in correspondence to the individual pixels 10, as well as the correlated double sampling. This means that the arithmetic operation unit 80 functions as a correction/inter-pixel arithmetic operation unit, fulfilling the role of a correction unit that generates a corrected signal by subtracting the value indicated in one digital signal from the value indicated in the other digital signal and also fulfilling the role of an inter-pixel arithmetic operation unit that executes an arithmetic operation with corrected signals, each generated in correspondence to one of the pixels 10. As a result, a smaller chip area is achieved in comparison to the chip area required if the correction unit and the inter-pixel arithmetic operation unit were to be disposed independently of each other.

The structure achieved in the embodiment includes the fourth substrate 114, in addition to the third substrate 113, at which the control units 70 are disposed. The arithmetic operation units 80, the multiplexers 85 and the like are disposed at the fourth substrate 114. Thus, the signal lines 123 and signal lines 124, disposed in a two-dimensional pattern, can be commonly connected to the operation units 100 of all the pixels 10 without increasing the chip area. By outputting a control signal from a control unit 70 and controlling the corresponding arithmetic operation unit 80, multiplexer 85 and the like with the control signal, an arithmetic operation can be executed by using corrected signals from selected pixels 10. Such an arithmetic operation can be executed with the corrected signals from adjacent pixels or from pixels disposed in areas set apart from each other. Furthermore, the corrected signal from another pixel 10, to be used in the arithmetic operation executed in an operation unit 100 is directly transmitted through a signal line 123 and a signal line 124 without going through a latch, a register or the like. Since this eliminates any time delay, which would occur when a signal passes through a latch, a register or the like, the signal can be read out at high speed, and the arithmetic operation can be executed at high speed in conjunction with signals from any selected pixels.

During a time period elapsing between a time point t50 and a time point t60, the arithmetic operation unit 80 outputs the pixel signal stored in the storage unit 83 to the demultiplexer 84. The demultiplexer 84 outputs the pixel signal to the signal line 122. The sense amplifier 300 amplifies the pixel signal output to the signal line 122 and reads out the amplified pixel signal. The individual operation units 100, each disposed in correspondence to one of the pixels 10, sequentially output signals to the signal line 122, and the sense amplifier 300 sequentially reads out the signals output to the signal line 122.

During a time period elapsing between a time point t70 and a time point t80, the pixel signals having been read out by the sense amplifier 300 are sequentially stored into the line memory 310. The input/output unit 320 executes signal processing on the signals sequentially output from the line memory 310 and outputs the signals resulting from the signal processing as image signals.

The following advantages and operations are achieved through the embodiment described above.

(1) The image sensor 3 comprises a plurality of pixels 10 each having a photoelectric conversion unit 12 and an operation unit 100 disposed in correspondence to each of the pixels 10, which generates a corrected signal by using a photoelectric conversion signal output from the pixel 10 and a noise signal output from the pixel 10 and executes an arithmetic operation with corrected signals each generated in correspondence to a pixel 10. In the embodiment, prior to the arithmetic operation executed by using the signals from the individual pixels 10, a corrected signal is generated through correlated double sampling. Thus, the arithmetic operation can be executed with the signals from selected pixels 10 by using signals from which the noise signal component has been removed in correspondence to the individual pixels 10.

(2) The operation unit 100 includes an A/D conversion unit 60 that converts the photoelectric conversion signal to a first digital signal and converts the noise signal to a second digital signal and a correction/inter-pixel arithmetic operation unit (arithmetic operation unit 80) that generates a corrected signal through subtraction executed in conjunction with the first digital signal and the second digital signal and executes an arithmetic operation with corrected signals each generated in correspondence to a specific pixel 10. This configuration makes it possible to reduce the area taken by peripheral circuits in each pixel, compared to the peripheral circuit area required if the correction unit and the inter-pixel arithmetic operation unit were to be disposed independently of each other, and thus, the chip area can be reduced.

(3) The photoelectric conversion unit 12 is disposed at the first substrate and at least part of the operation unit 100 is disposed at the second substrate. This structure makes it possible to prevent a reduction in the opening ratio of the pixel 10.

(4) The A/D conversion unit 60 converts the photoelectric conversion signal to the first digital signal with a first number of bits and converts the noise signal to the second digital signal with a second number of bits. Thus, digital signals obtained by individually converting the photoelectric conversion signal and the noise signal can be stored into the storage unit 50.

(5) The operation unit 100 includes a storage unit 83 where the second digital signal with the second number of bits is stored. The operation unit 100 executes subtraction in correspondence to one bit at a time by using the second digital signal stored in the storage unit 83 and the first digital signal output from the A/D conversion unit 60. Namely, the differential processing in the embodiment is executed in correspondence to one bit at a time in conjunction with the digital signal generated by converting the photoelectric conversion signal and the digital signal generated by converting the noise signal. Since this eliminates the need for disposing numerous flip-flop circuits and the like in correspondence to each pixel 10, an increase in the chip area can be avoided.

(6) The operation unit 100 executes an arithmetic operation in correspondence to one bit at a time by using corrected signals each generated in correspondence to a pixel 10. Thus, numerous basic mathematical operations circuits, flip-flop circuits and the like that would otherwise be required to execute inter-pixel arithmetic operations with signals from different pixels 10 do not need to be disposed, and as a result, an increase in the chip area can be avoided.

(7) The image sensor 3 further includes a plurality of signal lines (signal lines 123 and signal lines 124) to which the plurality of operation units 100 are connected and to which corrected signals are output from the operation unit 100. The operation units 100 each include a first selection unit (multiplexer 85) that selects corrected signals to be used in an arithmetic operation executed at the operation unit 100 from corrected signals output to a plurality of signal lines. In the embodiment, the arithmetic operation unit 80 and the multiplexer 85 are controlled by the control unit 70 so as to read out selected corrected signals originating from different pixels 10. This means that an arithmetic operation can be executed by using corrected signals from selected pixels 10.

(8) The image sensor 3 includes a pixel substrate (first substrate 111) which includes a plurality of pixels 10 each having a photoelectric conversion unit 12 that generates an electric charge through photoelectric conversion of light having entered therein and an output unit 20 (readout unit 20) that generates a signal based upon the electric charge and outputs the generated signal, and an arithmetic operation substrate (fourth substrate 114), laminated on the pixel substrate that includes operation units (arithmetic operation units 80) each of which generates a corrected signal based upon a reset signal generated after the electric charge in the output unit 20 is reset and a photoelectric conversion signal generated based upon the electric charge generated in the photoelectric conversion unit 12 and executes an arithmetic operation with corrected signals each generated in correspondence to a pixel 10. This structure makes it possible to execute an arithmetic operation with signals from selected pixels 10 from which the noise signal component has been removed in correspondence to the individual pixels 10. In addition, since the arithmetic operation units 80 are each laminated on the corresponding pixel 10, the opening ratio of the pixels 10 is not reduced.

(9) The image sensor 3 includes an accumulation substrate (second substrate 112) that includes accumulating units (storage units 50) in each of which a photoelectric conversion signal and a reset signal having been converted to digital signals are accumulated. The accumulation substrate is laminated at a position between the pixel substrate and the arithmetic operation substrate. This structure prevents the opening ratio of the pixels 10 from becoming reduced.

The following variations are also within the scope of the present invention, and one of the variations or a plurality of the variations may be adopted in combination with the embodiment described above.

(Variation 1)

Figure 7:
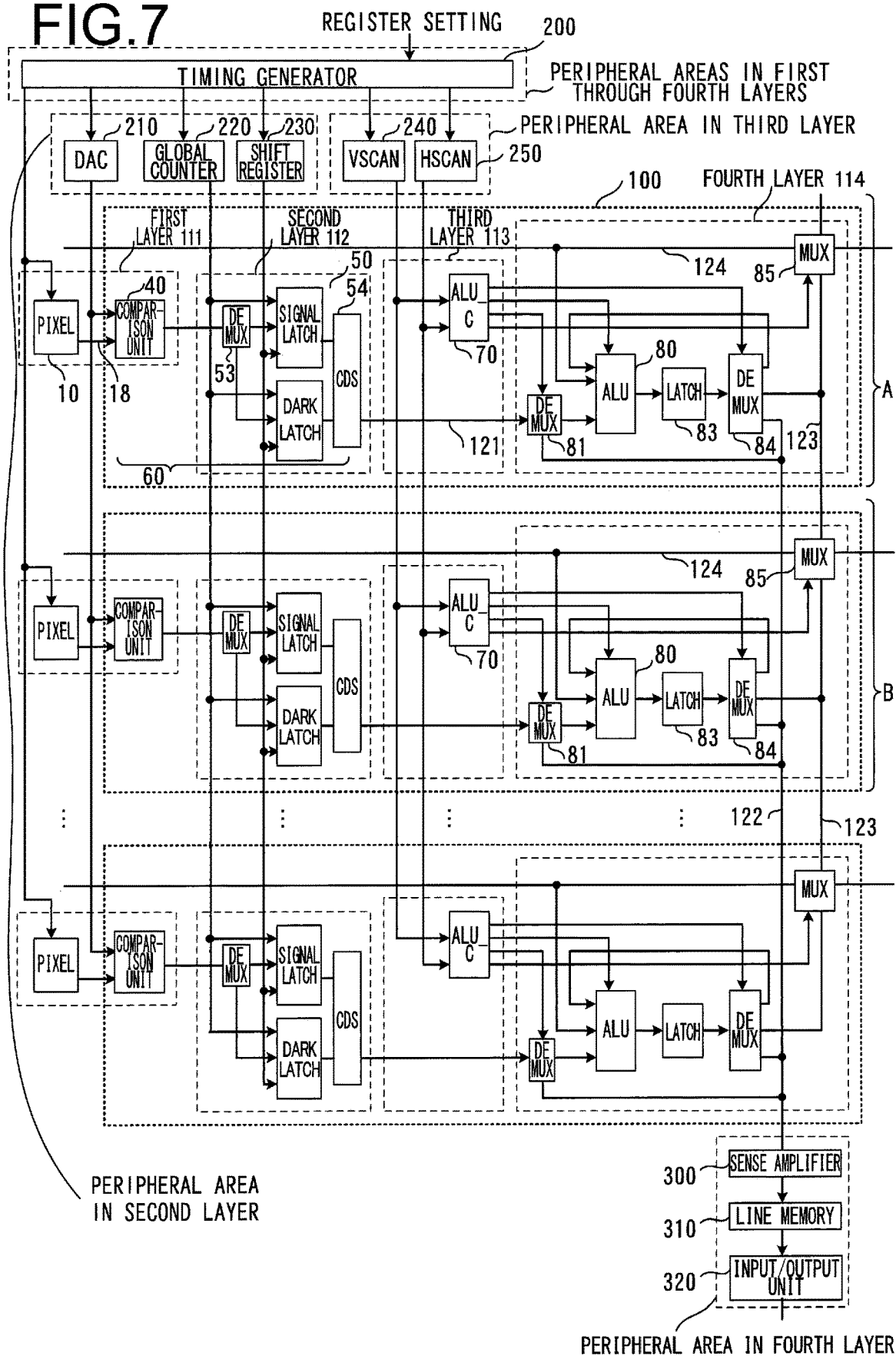

In the embodiment described above, the arithmetic operation units 80 are each used as a correction unit that executes CDS processing and also as an inter-pixel arithmetic operation unit engaged in inter-pixel arithmetic operation. However, a correction unit 54 dedicated to executing the CDS processing may be disposed as a unit independent of the arithmetic operation unit 80, as illustrated in FIG. 7. In this case, the arithmetic operation unit 80 simply functions as an inter-pixel arithmetic operation unit. The correction unit 54 generates a corrected signal through subtraction executed by using the digital signal generated from the photoelectric conversion signal and output from the signal storage unit 51 and the digital signal generated from the noise signal and output from the noise storage unit 52, and outputs the corrected signal thus generated to the arithmetic operation unit 80 via the demultiplexer 81.

(Variation 2)

In the embodiment described above, pixel signals resulting from the inter-pixel arithmetic operations are sequentially output to the sense amplifier 300 via the signal line 122. As an alternative, the operation units 100 may each output the corrected signal stored in the storage unit 83 as a pixel signal to the sense amplifier 300 via the signal line 122. As a further alternative, the digital signal corresponding to the photoelectric conversion signal, stored in the signal storage unit 51, and the digital signal corresponding to the noise signal, stored in the noise storage unit 52, may both be output to the signal line 122 via the demultiplexer 81.

(Variation 3)

In the embodiment described above, the CDS processing and the inter-pixel arithmetic operation are both executed in correspondence to one bit at a time by allocating a time slot to each bit through time division. As an alternative, an arithmetic operation may be executed in correspondence to a plurality of bits at a time by controlling the arithmetic operation unit 80 and the like through the control unit 70. For instance, the arithmetic operation may be executed in correspondence to two bits at a time, or it may be executed in correspondence to a specific number of bits, smaller than the number of bits in the digital signal stored in the noise storage unit 52, at a time.

(Variation 4)

In the embodiment described above, digital CDS is executed before the arithmetic operation is executed by using signals from individual pixels 10. However, analog CDS may be executed instead before the arithmetic operation is executed by using signals from different pixels 10. For instance, differential processing may be executed by using the photoelectric conversion signal and the noise signal and then an analog signal generated based upon the difference between the signals may be converted to a digital signal at each A/D conversion unit 60. A digital signal from which the noise signal component in the particular pixel 10 has been removed is stored into the storage unit 50. The digital signal stored in the storage unit 50 is then sequentially output to an arithmetic operation unit 80.

(Variation 5)

In the embodiment described above, the photoelectric conversion units 12 are each constituted with a photodiode. However, a photoelectric conversion unit 12 constituted with a photoelectric conversion film may be used, instead.

While an embodiment and variations thereof are described above, the present invention is in no way limited to the particulars of these examples. Any mode conceivable within the scope of the technical teaching of the present invention is also within the scope of the present invention.

The disclosure of the following priority application is herein incorporated by reference:

Japanese Patent Application No. 2016-60001 filed Mar. 24, 2016

REFERENCE SIGNS LIST

3 image sensor, 12 photoelectric conversion unit, 10 pixel, 40 comparison unit, 60 A/D conversion unit, 100 operation unit

The invention claimed is:

1. An image sensor comprising:
a first substrate provided with an arithmetic unit that calculates: (i) a first signal that is based upon an electric charge generated by a photoelectric conversion unit that photoelectrically converts light and (ii) a second signal for correcting the first signal; and
a second substrate provided with a control unit that controls the arithmetic unit.

2. The image sensor according to claim 1, wherein:
a corresponding one of a plurality of the control units is provided for each of a plurality of the arithmetic units.

3. The image sensor according to claim 1, further comprising:
a second wiring layer that (i) has a signal line to which is output a signal for controlling the arithmetic unit, and (ii) is laminated on the second substrate; and
a first wiring layer that (i) has a signal line electrically connected to the signal line of the second wiring layer, and (ii) is laminated on the first substrate, wherein:
the first wiring layer and the second wiring layer are provided between the first substrate and the second substrate.

4. The image sensor according to claim 1, wherein:
a corresponding one of a plurality of the arithmetic units is provided for each of a plurality of the photoelectric conversion units.

5. The image sensor according to claim 1, wherein:
the arithmetic unit is provided with a storage unit that stores the second signal.

6. The image sensor according to claim 1, further comprising:
a third substrate provided with a pixel that outputs the first signal, wherein:
the second substrate is provided between the first substrate and the third substrate.

7. An image capturing device comprising:
the image sensor according to claim 1; and
a generation unit that generates image data based upon a signal output from the image sensor.

8. An image sensor comprising:
a first pixel that has a first photoelectric conversion unit that photoelectrically converts light and that outputs a first signal that is based upon an electric charge generated by the first photoelectric conversion unit;
a second pixel that has a second photoelectric conversion unit that photoelectrically converts light and that outputs a second signal that is based upon an electric charge generated by the second photoelectric conversion unit; and
an arithmetic unit that calculates a third signal based upon the first signal and the second signal.

9. The image sensor according to claim 8, further comprising:
a first substrate on which the first pixel and the second pixel are provided; and
a second substrate on which the arithmetic unit is provided.

10. The image sensor according to claim 8, further comprising:
a conversion unit that converts the first signal and the second signal into digital signals.

11. The image sensor according to claim 10, wherein:
the conversion unit has a first conversion unit that converts the first signal into a digital signal, and a second conversion unit that converts the second signal into a digital signal.

12. The image sensor according to claim 10, wherein:
the arithmetic unit calculates the third signal based upon the first signal and the second signal that have been converted into digital signals by the conversion unit.

13. The image sensor according to claim 8, wherein:
the arithmetic unit includes a storage unit that stores the third signal.

14. The image sensor according to claim 10, further comprising:
a first substrate on which the first pixel and the second pixel are provided;
a second substrate on which the arithmetic unit is provided; and
a third substrate on which the conversion unit is provided.

15. The image sensor according to claim 14, wherein:
the third substrate is provided between the first substrate and the second substrate.

16. The image sensor according to claim 14, further comprising:
a first wiring layer that (i) has a first signal line that outputs the first signal and a second signal line that outputs the second signal, and (ii) is laminated on the first substrate; and
a third wiring layer that (i) has a third signal line electrically connected to the first signal line and a fourth signal line electrically connected to the second signal line, and (ii) is laminated on the third substrate, wherein:
the first wiring layer and the third wiring layer are provided between the first substrate and the third substrate.

17. An image capturing device comprising:
the image sensor according to claim 8; and
a generation unit that generates image data based upon a signal output from the image sensor.

* * * * *